(12) United States Patent
Kobayashi

(10) Patent No.: US 7,032,209 B2
(45) Date of Patent: Apr. 18, 2006

(54) MASK PATTERN AND METHOD FOR FORMING RESIST PATTERN USING MASK PATTERN THEREOF

(75) Inventor: Shinji Kobayashi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 276 days.

(21) Appl. No.: 10/632,850

(22) Filed: Aug. 4, 2003

(65) Prior Publication Data

US 2004/0025139 A1     Feb. 5, 2004

(30) Foreign Application Priority Data

Aug. 2, 2002   (JP) .............................. 2002-226275

(51) Int. Cl.
*G06F 17/50* (2006.01)

(52) U.S. Cl. .......................................... 716/19; 716/21
(58) Field of Classification Search ............ 716/19–21; 430/5, 24
See application file for complete search history.

(56) References Cited

U.S. PATENT DOCUMENTS

| 6,047,116 A * | 4/2000 | Murakami et al. ............ 716/19 |
| 6,701,512 B1 * | 3/2004 | Sutani et al. ................. 716/21 |
| 2001/0036583 A1 * | 11/2001 | Hasegawa et al. ............. 430/5 |

FOREIGN PATENT DOCUMENTS

| JP | 3-201422 | 9/1991 |
| JP | 4-267537 | 9/1992 |
| JP | 4-273427 | 9/1992 |
| JP | 4-355910 | 12/1992 |

* cited by examiner

*Primary Examiner*—Paul Dinh
(74) *Attorney, Agent, or Firm*—Nixon & Vanderhye P.C.

(57) ABSTRACT

A mask pattern for multiple exposure for forming a resist pattern with an unvarying pattern pitch on a semiconductor wafer, which is utilized as in case where a mask pattern under a design having the width of an aperture pattern smaller than the width of a light-shielding pattern is used at one exposure, wherein the mask pattern for multiple exposure has a pattern pitch that is the same as that of the mask pattern under design and has the width of an aperture pattern greater than the width of a light-shielding pattern.

7 Claims, 9 Drawing Sheets

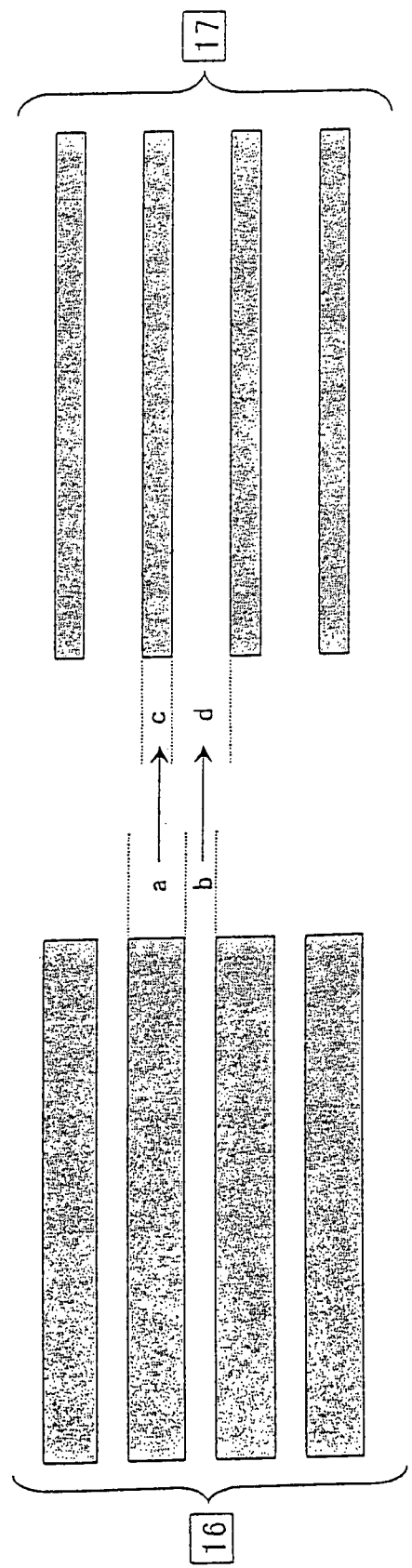

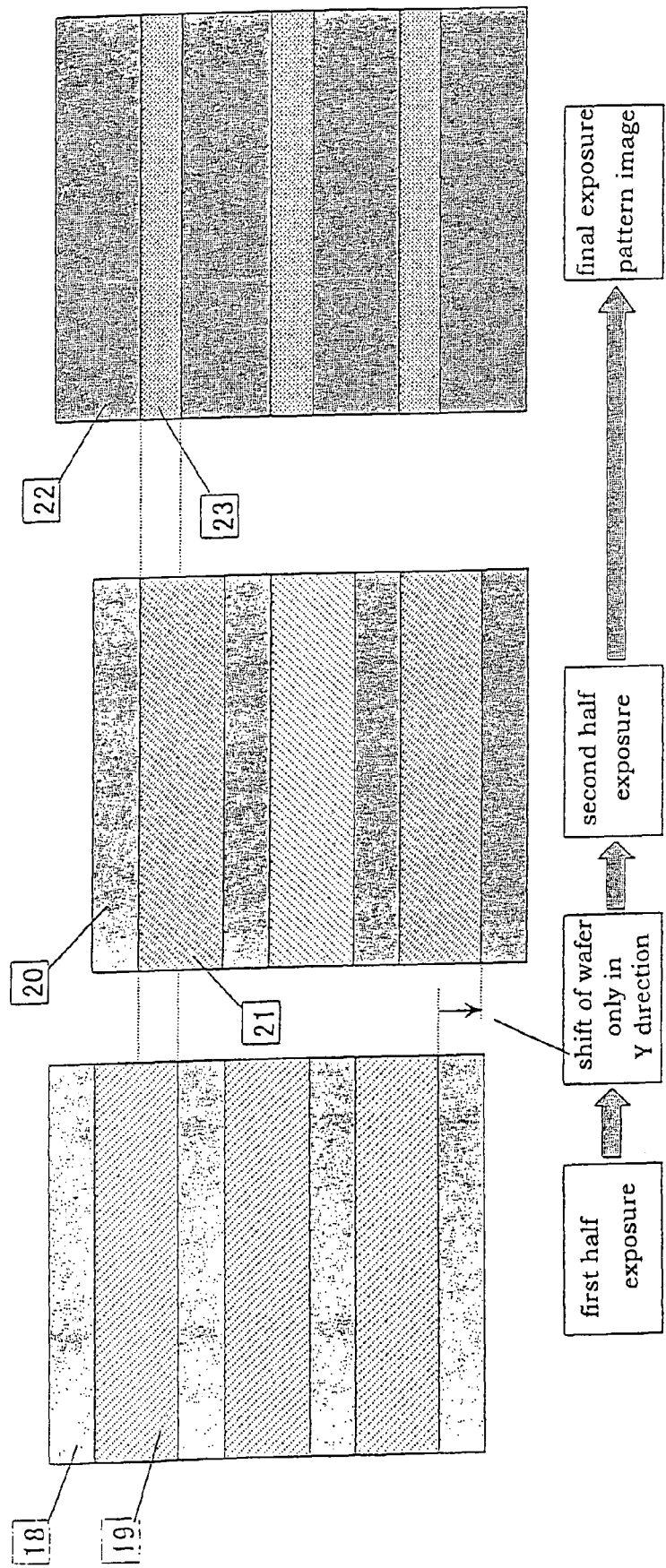

MASK PATTERN AND METHOD FOR FORMING RESIST PATTERN USING MASK PATTERN THEREOF

CROSS-REFERENCE TO RELATED APPLICATION

This application is related to Japanese application No. 2002-226275 filed on Aug. 2, 2002, whose priority is claimed under 35 USC § 119, the disclosure of which is incorporated by reference in its entirety.

BACKGROUND OF THE INVENTION

1. Field of the Invention

The present invention relates to a mask pattern and to a method for forming a resist pattern using the mask pattern thereof, in particular relates to a mask pattern wherein the amplification ratio of mask CD (critical dimension: minimum dimension) dispersion at the time of transcription to a wafer by means of exposure is reduced so that the mask pattern contributes to an increase in the precision of a resist CD in the formation of a resist pattern, and relates to a method for forming a resist pattern using the mask pattern thereof.

2. Description of the Background Art

In recent years, miniaturization of resist patterns has greatly been dependant on progress in photolithographic technology, which has primarily been due to reduction in the wavelength of the exposure light. Process dimensions have generally been set at values equal to the wavelength of the exposure light, or greater, up to the 0.25 µm generation (process dimensions of 250 nm), as shown in FIG. 1.

However, at present miniaturization of process dimensions tends to be achieved, because of the high cost of exposure units, without further reduction in the wavelength of the exposure light due to progress in miniaturization of factors other than reduction in wavelength and due to super resolution technology such as scanning light exposure technology, illumination formation technology, super resolution mask technology, and the like. And, as a result, a reverse phenomenon occurs wherein process dimensions are smaller than the wavelength of exposure light (KrF excimer laser: 248 nm) from the 0.18 µm generation. A variety of technologies have been developed for the formation of resist patterns in order to deal with the further miniaturization of such process dimensions.

Japanese Unexamined Patent Publication No. HEI 3(1991)-201422 discloses a method for adjusting the difference in dimensions that occur concerning the position where the hole pattern is placed by transcribing two reticle patterns to the same position on a wafer.

Japanese Unexamined Patent Publication No. HEI 4(1992)-267537 discloses a method for preventing the transcription of a shifter edge of a phase shift mask by means of a double exposure and discloses a method for eliminating the above described resist slits by exposing and shifting a micro doped wafer followed by a second exposure.

Japanese Unexamined Patent Publication No. HEI 4(1992)-273427 and Japanese Unexamined Patent Publication No. HEI 4(1992)- 355910 disclose a technique for increasing the focal point depth of an isolated pattern by means of a double exposure utilizing two masks. That is to say, according to this technique a periodic pattern including an isolated pattern is transcribed using a first mask and, then, unnecessary patterns other than the isolated pattern are exposed and eliminated using the second mask.

A variety of super resolution technologies, as described above, are utilized in photolithography for implementing process dimensions equal to, or less than, the wavelength of the exposure light and several problems occur that do not occur in photolithography for processing dimensions equal to, or greater than, the exposure light according to a prior art. The most critical problem from among these is the deterioration of MEEF (mask error enhancement factor).

The MEEF is a numeric value gained by dividing the amount of fluctuation in the resist dimensions on a wafer by the amount of fluctuation in the mask dimensions (converted value of one factor) and is utilized as an indication that shows the resultant amplification ratio wherein the dispersion in the mask dimensions corresponds to the dispersion in the resist dimensions on a wafer.

FIG. 2 is a graph showing the relationships between the actually measured values of the mask CD and the resist dimensions on a wafer. FIG. 2(a) shows the characteristics of line-type isolated patterns (target value of line width of 180 nm) and FIG. 2(b) shows the characteristics of a periodic pattern of lines and spaces (target value of line/space intervals of 180 nm). Fine lines 1, 3 in FIG. 2 indicate cases of dimension processing of the wavelength of the exposure light, or greater, according to a prior art and bold lines 2, 4 in FIG. 2 indicate cases of dimension processing of the wavelength of the exposure light, or less, according to technology developed in recent years.

The MEEF by definition corresponds to the inclination of the respective characteristics lines in FIG. 2. The MEEF is essentially 1.0 (fine line 1 of FIG. 2(a) and fine line 3 of FIG. 2(b)) in accordance with photolithography of a prior art wherein dimensions equal to, or greater than, the wavelength of the exposure light are achieved in processing. In this case the value gained by dividing the dispersion in the dimensions of the mask pattern by magnification of the scale down projection system is the dispersion in the dimensions of the resist pattern on a wafer.

However, the MEEF increases to a range of from 1.5 to 4 according to the photolithography (bold line 2 of FIG. 2(a) and bold line 4 of FIG. 2(b)) for implementing the process dimensions of the wavelength of the exposure light, or less, and, therefore, the dispersion (converted value of one factor) in the mask dimensions is amplified from 1.5 to 4 times so as to be transcribed to the resist pattern on the wafer. Here, the above described MEEF ranges widely from 1.5 to 4 because the MEEF depends on the pattern size and pitch, layout and form.

The space size (area through which exposure light passes) is considered to be constant in the line-type isolated pattern of FIG. 2(a) so that the condition of the diffracted light is stable, that is to say, fluctuation in the angle of diffraction is small and, therefore, it is understood that the value of MEEF approximates 1.0.

On the other hand, it is understood that the inclination of bold line 4 in the periodic pattern of lines/spaces of FIG. 2(b) is greater than the inclination of bold line 2 of FIG. 2(a).

That is to say, it is understood that the fluctuation in the angle of diffraction corresponds to change in space size and is great resulting in deterioration in the value of MEEF because space size is small in comparison with the wavelength. It is understood that the lithography is in the condition wherein the transcription linearity has deteriorated due to the fact that the angle of diffraction becomes optically great as the space size is reduced.

As described above, the value of MEEF is a coefficient (amplification ratio of the dimensional dispersion) for determining the dimensional dispersion in the resist on the final wafer from the dimensional dispersion in the mask pattern.

In recent years, the reduction in this MEEF value has become an important issue for photolithography that implements process dimensions of the wavelength of the exposure light, or less.

SUMMARY OF THE INVENTION

The present invention is provided in view of the above described problems and a purpose thereof is to provide a method for forming a resist pattern according to which the value of MEEF is reduced and, thereby, dispersion in the resist dimensions on a wafer is reduced.

The present invention provides a mask pattern for multiple exposure for forming a resist pattern with an unvarying pattern pitch on a semiconductor wafer, which is utilized as in case where a mask pattern under a design having the width of an aperture pattern smaller than the width of a light-shielding pattern is used at one exposure, wherein the mask pattern for multiple exposure has a pattern pitch that is the same as that of the mask pattern under design and has the width of an aperture pattern greater than the width of a light-shielding pattern.

Furthermore, the present invention provides a method for forming a resist pattern comprising: a step for exposuring a resist on a semiconductor wafer using the mask pattern of claim 1, a step for shifting the semiconductor wafer or the mask pattern by a microscopic amount, both of the above two steps being repeated at a plurality of times, and a step for removing a region of the resist where multiple exposure has been undergone by developing at the time when a resist pattern with an unvarying pattern pitch is formed.

That is to say, the size of the transmission portion in the mask pattern is greater than that of the resist (space) pattern on a wafer and, therefore, the value of the MEEF can be greatly reduced in photolithography wherein the width is equal to, or smaller than, the wavelength of the exposure light.

Furthermore, multiple exposure using the above described mask pattern is not a transcription shift due to underexposure and the portion wherein the multiple exposure is carried out gets an appropriate amount of exposure light at the time when the multiple exposure is carried out and, therefore, deterioration of the exposure margin does not occur according to the method for forming a resist pattern of the present invention.

A resist pattern having a low MEEF and an excellent resolution can be formed without a transcription shift by utilizing a conventional unit by means of the mask pattern according to the present invention or by means of a method for forming a resist pattern for carrying out multiple exposures of a semiconductor wafer using such a mask pattern.

BRIEF DESCRIPTION OF THE DRAWINGS

FIG. 8(a) and FIG. 8(b) are plan views for describing a method for forming a mask pattern according to the present invention; and FIG. 9(a). FIG. 9(b), and FIG. 9(c) are plan views for describing a method for exposure with light according to the present invention.

PREFERRED EMBODIMENTS OF THE INVENTION

Figure 1:
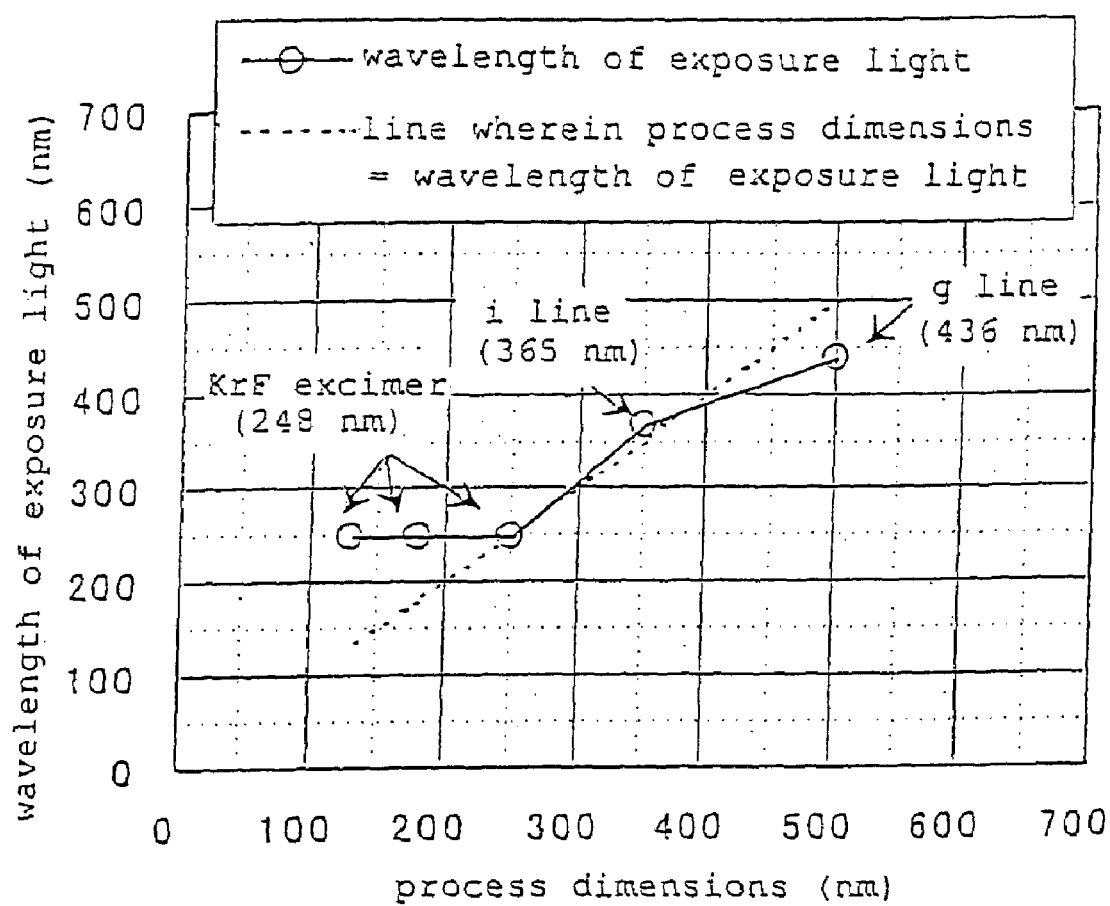
FIG. 1 is a graph showing the relationship between the process dimensions and the wavelength of the exposure light.
Figure 2:
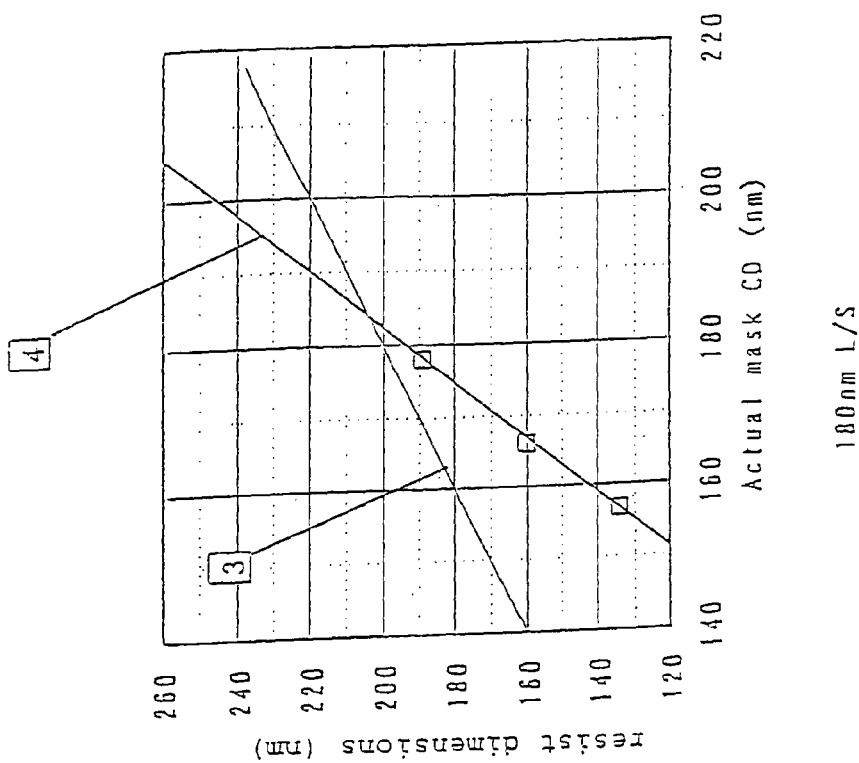
FIG. 2(a) is a graph showing the MEEF of an isolated line system at the time of transcription of a 180 nm pattern and, FIG. 2(b) is a graph showing the MEEF of line and space system at the time of transcription of a 180 nm pattern.
Figure 2:
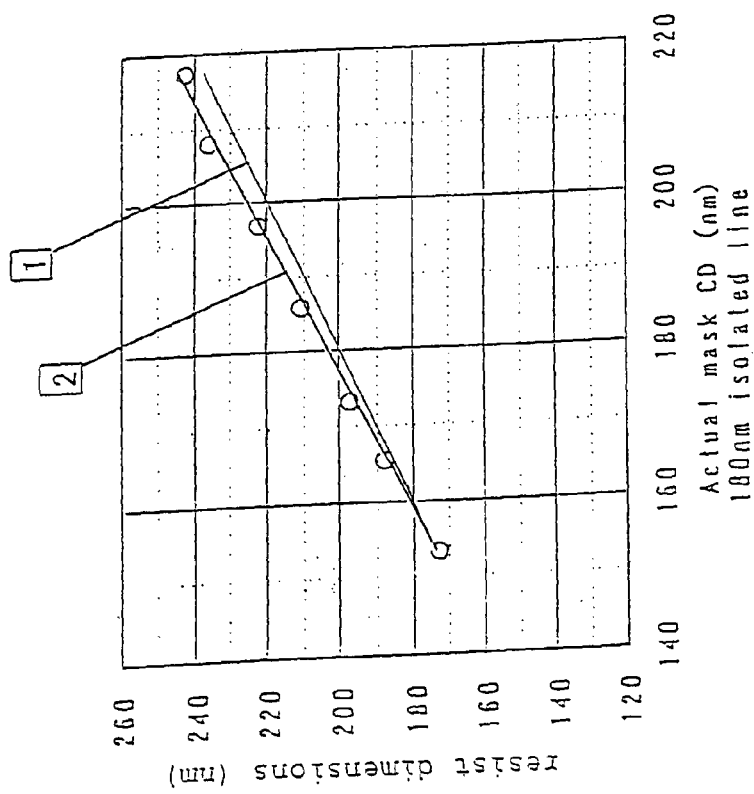

The mask pattern according to the present invention may be formed of a metal such as chrome or silicon.

The aperture pattern for forming the mask pattern may be formed using a halftone mask or a Levenson mask that becomes a phase shifter. In that case, light contrast at the time of transcription increases and, at the same time, the value of MEEF is reduced.

The light-shielding pattern for forming the mask pattern is formed using a binary mask made of chrome or a halftone mask made of MoSiO. In that case, the light contrast increases at the time of transcription and, at the same time, the value of the MEEF is reduced.

The "case where a mask pattern under a design having the width of an aperture pattern smaller than the width of a light-shielding pattern is used at one exposure" in the present invention indicates the case wherein the width (line width) of the aperture pattern is less than 100% of the width (space width) of the light-shielding pattern.

The "width of aperture pattern greater than the width of a light-shielding pattern" in the mask pattern of the present invention indicates the case wherein the width (line width) of the aperture pattern exceeds 100% of the width (space width) of the light-shielding pattern.

The "step for shifting the semiconductor wafer or the mask pattern by a microscopic amount" in the present invention indicates the step of shifting either the semiconductor wafer or the mask pattern relative to the other of the semiconductor wafer or the mask pattern, which is fixed, or the step of shifting both the semiconductor wafer and the mask pattern wherein the amount of shift differs for each.

The direction of shift in this shift step is the direction of the pitch of the pattern. In addition, the distance of shift by a "microscopic amount" indicates a distance of shift that is less than 100% of the width (line width) of the aperture pattern. The distance of shift of a semiconductor wafer or mask pattern by a microscopic amount is determined in accordance with the number of exposures.

The approach of the inventors in regard to the present invention is described below.

Several methods have been developed as methods for reducing the above described MEEF value in photolithography for implementing process dimensions equal to, or smaller than, the wavelength of the exposure light.

Improvements in a so-called super resolution mask for enhancement of the light contrast itself is considered to be a generally used technique. The value of MEEF is reduced when the mask performance (light contrast) is enhanced wherein transcription is carried out using the same wavelength of exposure light in each case. It is known that the order of light contrast, from lowest to highest, as well as the order of MEEF value, from highest to lowest, at the time of transcription regarding the use of the following three mask types is: chrome mask→halftone mask→Levenson-type phase shift mask.

The inventors focused on and examined the dependency of the ratio of white to black (ratio of aperture portion/light-shielding portion for the same pattern pitch) of the mask pattern and of the resist pattern transcribed onto a wafer as a method for reducing the MEEF.

Here, the ratios of white to black of the mask pattern and of the resist pattern on a wafer always agree with each other and positive resists were used for gaining the data according to evaluation in the following examinations. In addition, a KrF excimer laser (248 nm) was used for exposure and two types of masks, a halftone mask and a Levenson mask, were evaluated.

First, the characteristics of a halftone mask and of a Levenson mask were examined.

A halftone mask and a Levenson mask are each masks that use a phase shift method and a phase shift mask is a photomask wherein a pattern of a phase shifter for inverting the phase of the exposure light by 180 degrees is used as a mask pattern. Thereby, the light that is transmitted through the mask is controlled to have phases of 0 degrees and 180 degrees so that the interference of light of 0 degrees and 180 degrees is utilized, and improvement in the resolution on the wafer can be achieved.

The phase shifter is formed through the placement of a translucent film or through inscription of a quarz substrate. A halftone mask is a mask having a translucent film and a Levenson mask is a mask made through inscription of a quarz substrate.

Figure 3:
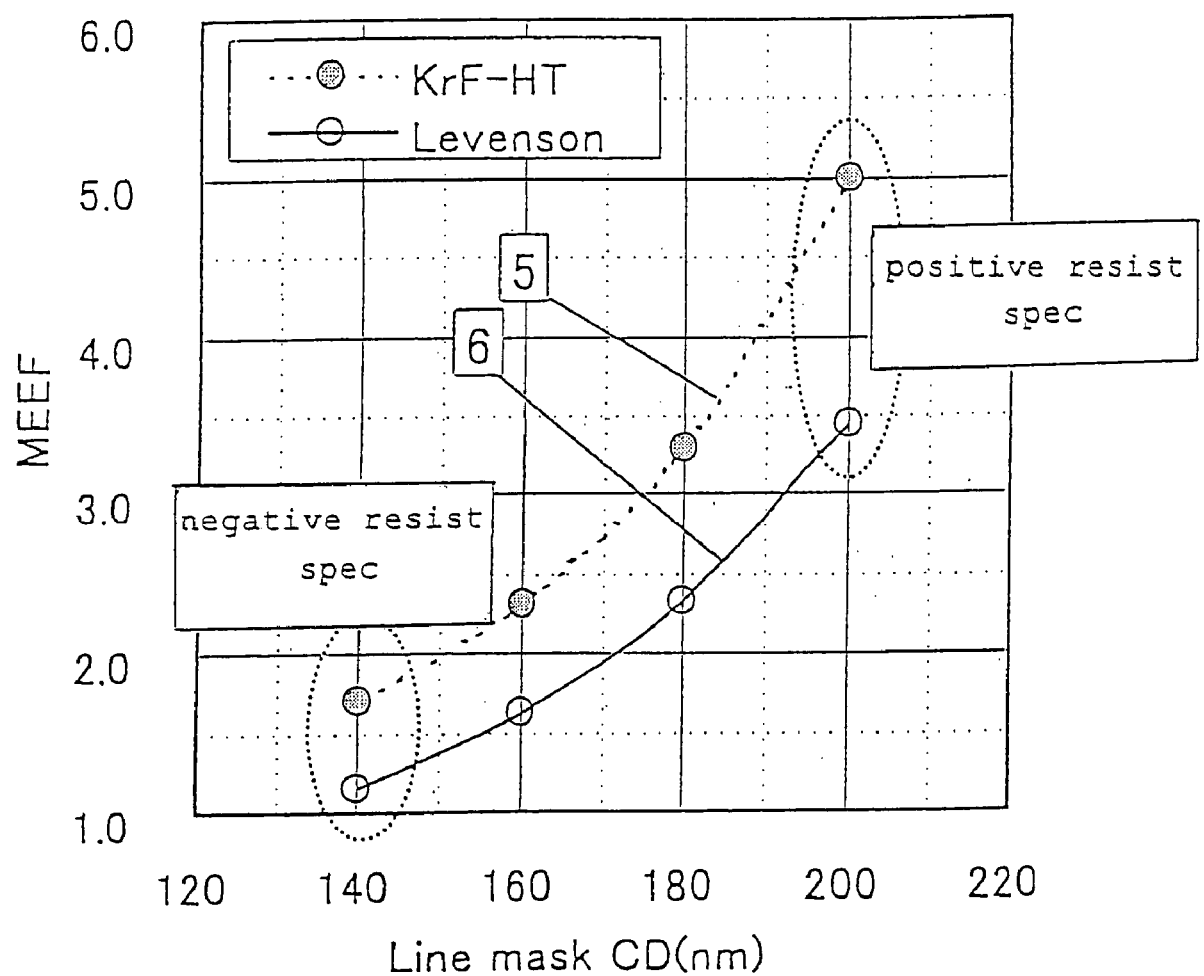
FIG. 3 is a graph showing the dependency of the MEEF on the mask CD.

FIG. 3 is a graph showing the MEEF versus mask CD characteristics of a halftone and of a Levenson mask, respectively, in the case wherein a line pattern with a pitch of 340 nm is used. In FIG. 3 the characteristics of the halftone mask when a KrF excimer laser is used as the light source are indicated by a broken line 5 (KrF-HT) and the characteristics of the Levenson mask are indicated by a solid line 6 (Levenson).

In general, a Levenson mask is appropriate for microscopic processing because the light intensity is not lowered even after the light has passes through the phase shifter resulting in a great interference effect and a Levenson mask requires a fixed pattern in order to gain an interference effect while a halftone mask allows the formation of a random pattern and has the characteristics wherein the light intensity is lowered when the light passes through the translucent phase filter resulting in a small interference effect.

Figure 4:
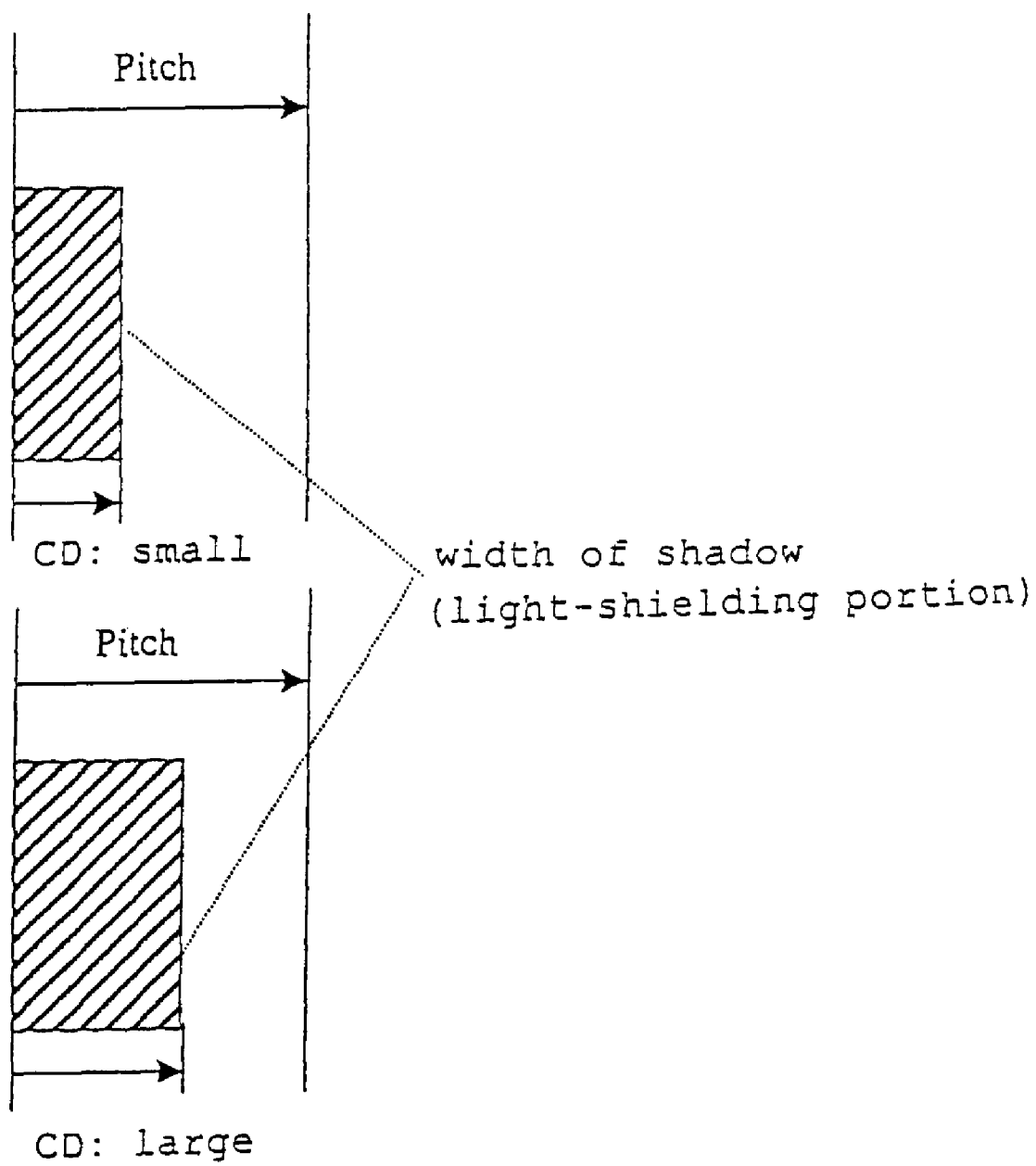
FIG. 4 is a diagram showing change in the width of the shadow in the case wherein the ratio of white to black of a mask pattern is changed while the pattern pitch is fixed.

FIG. 4 is a diagram showing the case wherein the pattern pitch is fixed while the ratio of white to black of the mask pattern is changed.

As shown in FIG. 4, the MEEF value dramatically increases when the shadow width (light shielded portion corresponding to the X axis in the graph of FIG. 3) is increased. That is to say, it is understood that the MEEF value is considerably reduced when the width of the illuminated area (aperture portion) is increased. This is because it is considered that the expansion of the diffraction angle of the exposure light is restricted when the size of the aperture portion in the mask is increased and, thereby, fluctuation in the intensity of the transmitted light relative to fluctuation in the size of the aperture becomes small. Behavior similar to this phenomenon tends to occur regardless of the type of mask.

Figure 5:
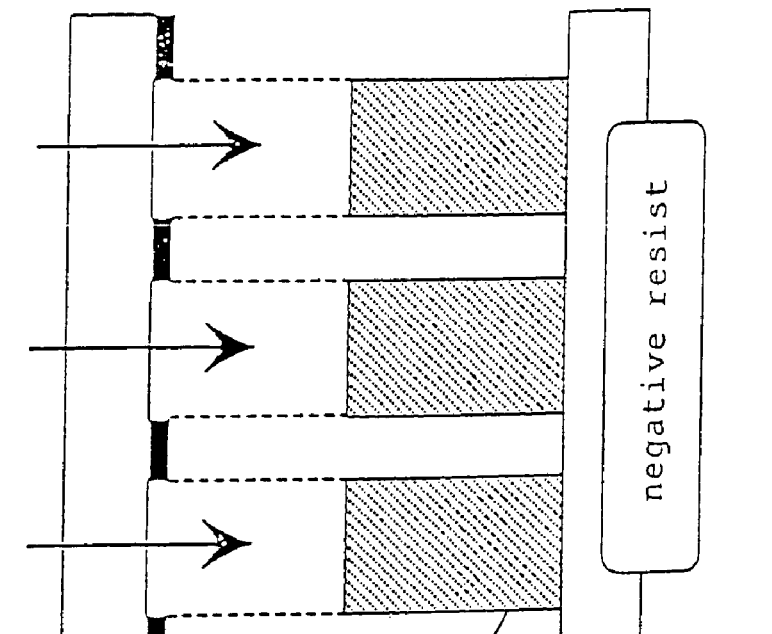
FIG. 5(a) is a cross sectional view showing the step of forming a narrow resist space pattern in the case of the usage of a positive resist and, FIG. 5(b) is a cross sectional view showing the step of forming a narrow resist space pattern in the case of the usage of a negative resist.
Figure 5:
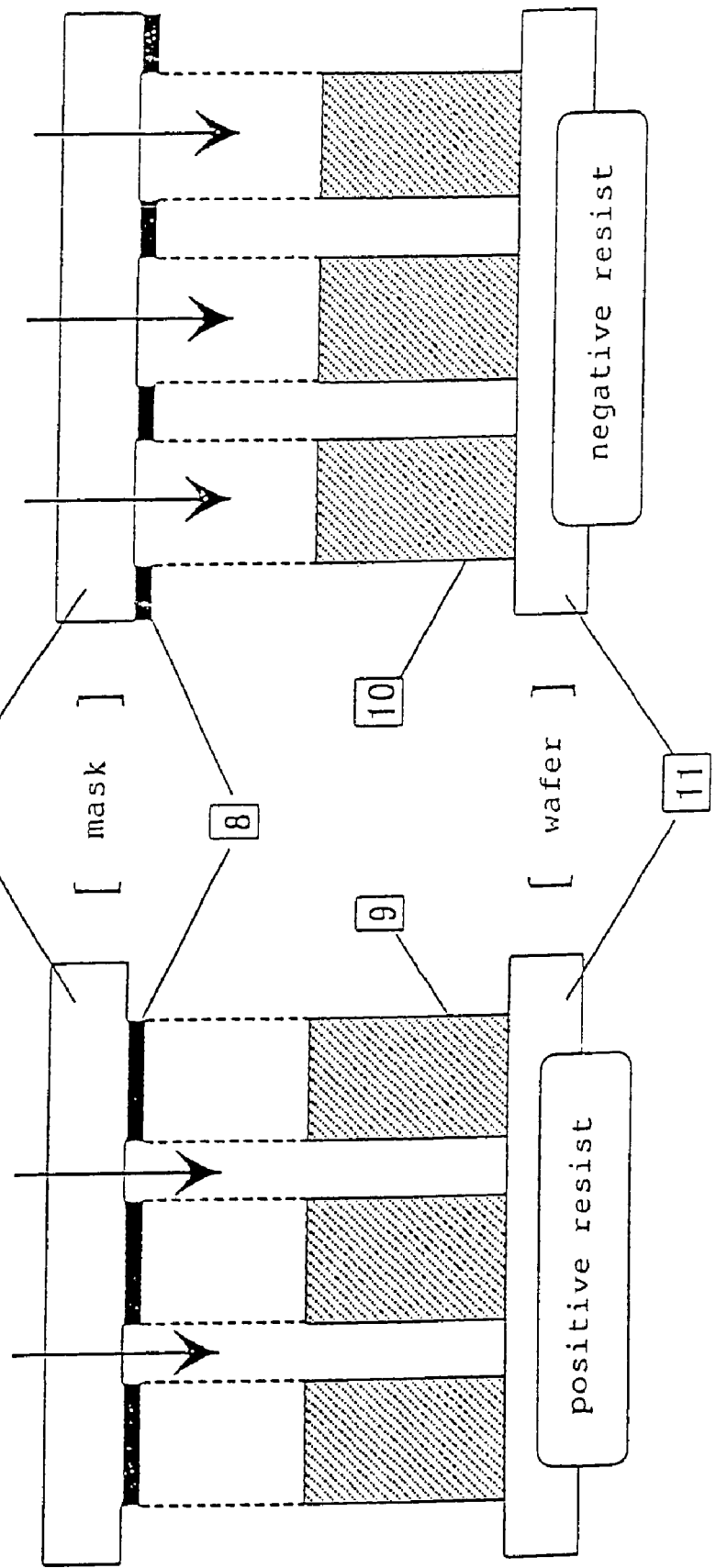

FIG. 5 shows cross sectional views of the step of the formation of a narrow resist space pattern in the cases (a) wherein a mask for a positive resist is used and (b) wherein a mask for a negative resist is used.

In the figure, a quarz substrate that is a mask is denoted as 7, a light-shielding pattern is denoted as 8 and a wafer substrate is denoted as 11. Light-shielding pattern 8 is formed of a halftone film such as of chrome or of MoSiO.

FIG. 5(a) shows the case wherein a mask for a positive resist is used in order to form a positive resist 9 while FIG. 5(b) shows the case wherein a mask for a negative resist is used in order to form a negative resist 10 having the same form as of positive resist 9.

As is clear from FIG. 5, the size of the aperture is larger in case (b) wherein a mask for forming a negative resist 10 is used than in the case wherein a mask for forming a positive resist 9 having the same space size and having the same form as of negative resist 10 is used.

Theoretically, as described above, the MEEF decreases as the aperture size of the mask pattern increases in the case wherein a resist pattern having narrow spaces is assumed to be gained as shown in FIG. 5. That is to say, it is considered to be advantageous to adopt a negative resist from the point of view of increasing the MEEF.

Figure 6:
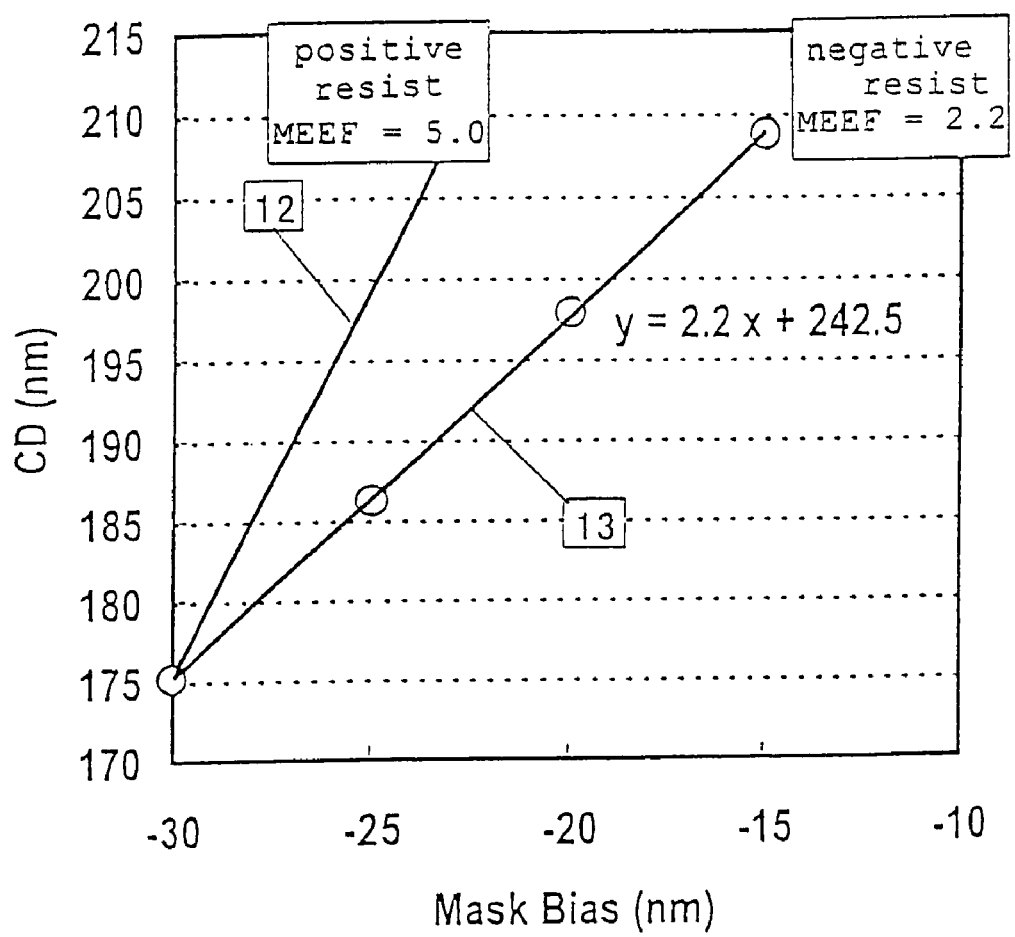
FIG. 6 is a graph showing the evaluation result of the MEEF in the case wherein a negative resist is applied.

FIG. 6 is gained by plotting the characteristics of a positive resist and of a negative resist wherein the variation (mask bias) of the mask CD is shown in the X axis direction and the size of the resist that has been formed is shown in the Y axis direction.

As for the above described conditions, a halftone mask is used for both the positive resist and for the negative resist, the pitch is 340 nm, the mask CD (shadow width) for the positive resist is 200 nm (width of illuminated portion is 140 nm) and the mask CD (shadow width) for the negative resist is 140 nm (width of illuminated portion is 200 nm).

It was confirmed as described above that the MEEF value is reduced by inverting the ratio of white to black of the mask pattern so as to convert the resist from a positive type to a negative type.

That is to say, the MEEF value is reduced from MEEF=5.0 in the case wherein the positive resist is used (line 12 of the graph) to MEEF=2.2 in the case wherein the negative resist is used (line 13 of the graph).

The effects of reduction in the MEEF value are small in comparison with the values for a mask having the same dimensions when the positive resist of FIG. 3 is used. That is to say, the MEEF value becomes 2.2=negative resist+ halftone mask of FIG. 6 in comparison with 1.7=negative resist+halftone mask of FIG. 3. It is estimated that the resist performance contributes to the above.

Figure 7:
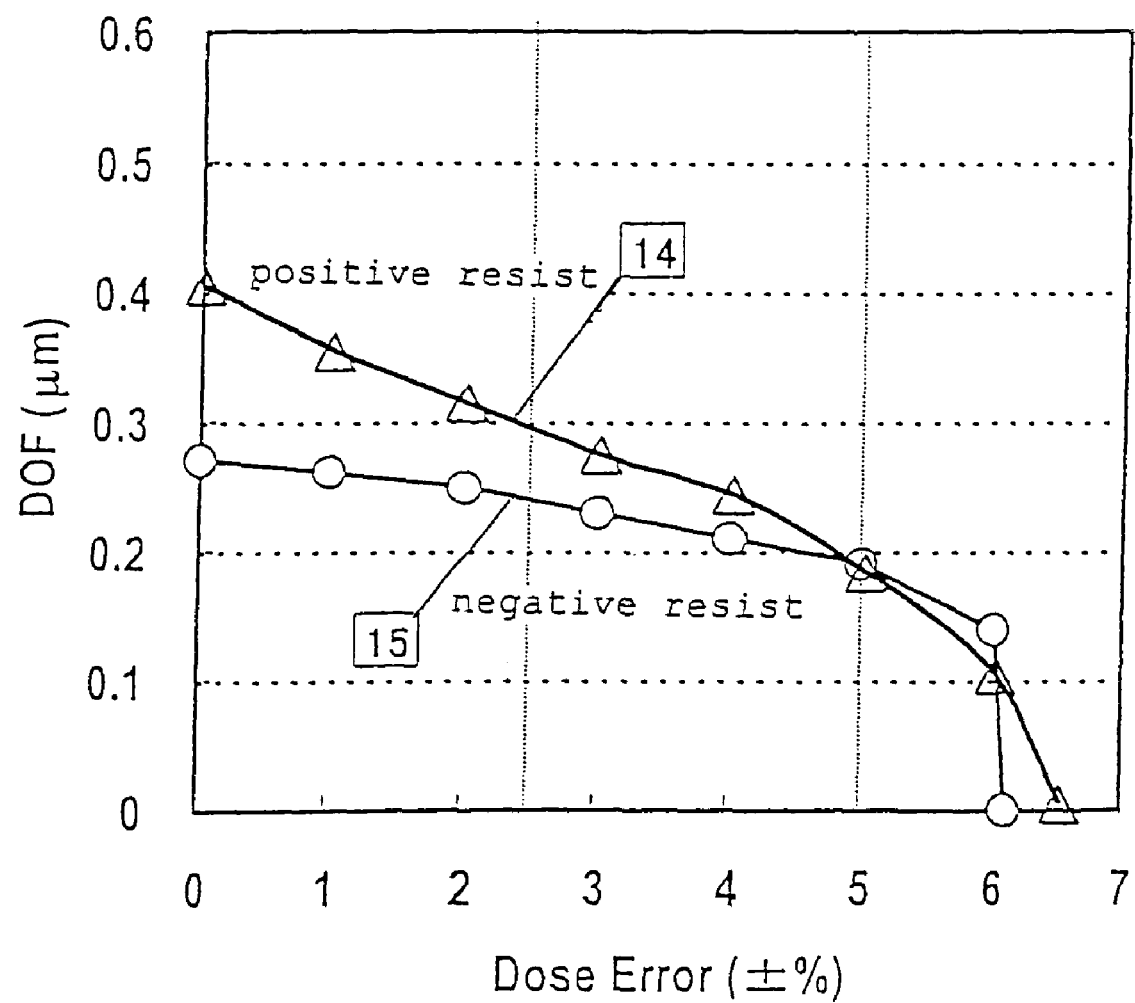
FIG. 7 is a graph showing the evaluation result of an ED-Tree in the case wherein a negative resist is applied.

FIG. 7 is gained by plotting the range of fluctuation of position in reference to the focal point of the light source wherein the fluctuation of the resist CD is within the allowable range in the respective cases wherein a positive resist and a negative resist are used, showing dose error (error in amount of exposure) in the X axis direction and showing DOF (depth of focus) in the Y axis direction.

As shown in FIG. 7, however, the performance found through evaluation of the DOF margin deteriorates in the case wherein a negative resist is used in comparison with the case wherein a positive resist is utilized. That is to say, it is understood that the greater is the value of DOF, the greater is the margin relative to the focal distance.

It is understood that the positive resist (line 14 of the graph) is superior to the negative resist (line 15 of the graph) from the point of view of the DOF in FIG. 7. This is because the DOF is affected by the resolution of the resist and the DOF is considered to have deteriorated due to the use of the negative resist because of the difference in the performance of the resists, though the MEEF value is reduced as a result of improvement in optical quality.

The utilization of a positive-type resist wherein the MEEF is reduced is meaningful in photolithographic technology, where presently the overwhelming number of commercially available photoresists utilize positive-type resolution. The MEEF is reduced when transcription is carried out by making the resist space ratio in the wafer smaller than the aperture portion ratio of the mask pattern in the above described FIG. 3. However, it is necessary in this case to take into consideration that the exposure is essentially less than the appropriate amount of exposure and, therefore, the margin in the amount of exposure decreases greatly as the amount of shift in transcription is increased.

Consequently, the inventors have made the present invention relating to a mask pattern and to a method for forming a resist pattern using the mask pattern thereof.

That is to say, it has become clear that the MEEF can be reduced by increasing the aperture portion (transmission portion) of the mask pattern when the mask pattern for multiple exposure of the present invention is designed in accordance with the above described examination and experimental results. In this case a condition is that the mask wherein a pattern is formed is resolved in a manner separately from the adjacent pattern.

Next, multiple exposure is carried out using the mask pattern thereof, that is to say, at least two exposures are carried out. According to the exposure sequence the first exposure is a half exposure and the semiconductor wafer or the mask pattern is shifted by a microscopic amount and, then, a second half exposure is carried out. In the case of the positive-type resist, a pattern is formed in a region wherein the first and second exposures overlap, that is to say, the amount of shift of the wafer is equal to the exposed region of the resist on the wafer.

At this time, it is possible to significantly increase the size of the aperture portion on the mask in comparison with the exposed region (resist space pattern) formed on the wafer and it is theoretically possible to significantly reduce the MEEF. In addition, transcription shift due to underexposure is not used but, rather, the portion that has undergone double exposure receives an appropriate amount of exposure and, therefore, the exposure margin does not deteriorate.

As described above, pattern formation by means of multiple exposures can be carried out using one mask according to the present invention.

Here, the prior art, including the above described gazettes, encompass many points of difference from the present invention wherein transcription to the same position on a wafer is carried out without shifting the position of the wafer, wherein the mask is not designed for the purpose of dimensional adjustment and wherein the amount of wafer shift is not set.

Preferred Embodiments of the Invention

In the following, the preferred embodiments of the present invention are described in detail in reference to the drawings. However, the present invention is not limited to these embodiments.

FIG. 8 is a plan view showing an example of a mask pattern for describing the present invention.

Here, the pattern of one mask, which is a phase shift mask, is used in the following in regard to an example wherein a resist pattern is formed by shifting a semiconductor wafer.

In FIG. 8, mask pattern 16 of FIG. 8(*a*) is a mask pattern according to a design characterized in that line width a is great and space width b is narrow. It is necessary to prepare a mask having a ratio of white to black (transmission portion/light-shielding portion) is 1:1 in order to gain a resist pattern on a wafer based on mask pattern 16 according to the design in the case wherein the transcription shift is assumed to be zero, that is to say, there is no deterioration in the exposure margin due to underexposure.

A method for forming a mask pattern for multiple exposure according to the present invention is described below.

When line width a of mask pattern 16 is changed to line width c, as shown in FIG. 8(*b*), without changing the pitch of mask pattern 16 according to the design of FIG. 8(*a*), space width d increases, of course. Mask pattern 16 according to the design of FIG. 8(*a*) becomes mask pattern for multiple exposure 17, as shown in FIG. 8(*b*), as a result of such pattern conversion.

Such a mask pattern 17 characterized by having a pattern pitch that is the same as that of mask pattern 16 according to the above described design and characterized in that the width of the aperture pattern is greater than the width of the light-shielding pattern can be used to reduce the MEEF value. Concrete evaluation results gained by combining the above described positive resist of FIG. 3 and a halftone mask are shown here. That is to say, it is clear that the MEEF value greatly decreases, from 5.0 to 1.7, in the case wherein the line width is changed from a=200 nm (converted value of one factor of the mask) to 140 nm.

FIG. 9 is a plan view of mask pattern 17 for describing an example of a method for formation of a resist pattern using mask pattern for multiple exposure 17, which has been formed as described above.

An example of a method for carrying out an exposure of a positive-type resist on a wafer using mask pattern 17 is described in reference to FIG. 9.

First, the first half exposure is carried out using mask pattern 17. Unexposed regions 18 and half-exposed regions 19 are formed in alternation on a wafer with the same pitch as a result of the first half exposure, as shown in FIG. 9(a).

Next, the second half exposure is carried out after shifting the wafer in the Y direction by D. Unexposed regions 20 and half exposed regions 21 are formed in alternation, on a wafer with the same pitch as a result of the second half exposure, as shown in FIG. 9(b).

As a result of this, regions 22, which are the portions other than the double exposed portions (regions that have been exposed one time and regions that have not been exposed at all), and regions 23, which have been exposed twice, are formed in alternation, on the wafer with the same pitch as a result of first and second half exposures, as shown in FIG. 9(c).

That is to say, the regions wherein the first and second exposures have overlapped, which are regions corresponding to the amount of shift of the wafer, are formed as a pattern of regions wherein the resist on the wafer has been exposed to light.

A resist pattern with a line width of 140 nm is formed of portions 23, which have been exposed twice, by setting shift amount D of a wafer at 140 nm in the case wherein, for example, the line width of mask pattern 17 is 140 nm and the pitch of the line width is 340 nm.

The MEEF value can be greatly reduced by means of the above described method for forming a mask pattern and by means of a method for forming a resist pattern through the combination of exposure methods using the mask pattern wherein a positive-type resist of a high resolution is utilized without using transcription shift so that deterioration in the exposure margin does not occur due to underexposure.

Here, though a case of the use of a phase shift mask is described according the above embodiment, the same effects can be gained in the case wherein a binary mask having chrome in the light-shielding portion is used and wherein the above described method for forming a mask pattern and the method for exposure using the mask pattern thereof can be applied.

As shown in the above described embodiment, the present invention allows the size of the transmission portion of the mask to become great in comparison with the resist (space) pattern on a wafer and, therefore, the MEEF value can be greatly reduced in photolithography for lines having a width equal to, or less than, the wavelength of the exposure light.

The MEEF value is greatly reduced from, for example, 5.0 to 1.7, in the case wherein the line width is changed from 200 nm (converted value of one factor of a mask) to 140 nm in the example of a halftone mask (KrF-HT), shown in FIG. 3.

In addition, the dimensional dispersion on a wafer becomes 25 nm (that is to say, 5.0×20/4), calculated from MEEF=5.0 at the time when only one exposure is carried out using a conventional mask in the case wherein the dimensional dispersion (max-min) of a state-of-the-art four factor mask (130 nm to 100 nm generation) is 20 nm.

On the other hand, the mask pattern of the present invention is used (that is to say, a mask having an enlarged transmission portion is used) to carry out two exposures with a wafer shift and, thereby, the dimensional dispersion on a wafer becomes 8.5 nm (=1.7×20/4), calculated from MEEF=1.7. That is to say, the present invention provides a reduction in the dimensional dispersion on a wafer that is proportional to the MEEF value.

Here, though a resist pattern is formed through two exposures utilizing mask pattern for multiple exposure 17 according to the above described embodiment, the number of exposures is not particularly limited as long as the number is equal to, or greater than, two.

The present invention allows a mask pattern to have a large transmission portion in comparison with the resist (space) pattern on a wafer and, therefore, the MEEF value can be greatly reduced in photolithography for a pattern having a line width equal to, or less than, the wavelength of the exposure light.

Furthermore, the portions that undergo multiple exposures are exposed with an appropriate amount of exposure light at the time when multiple exposures are carried out using the above described mask pattern because such multiple exposures are different from transcription shift entailing underexposure and, therefore, deterioration in the exposure margin does not occur according to the method for forming a resist pattern of the present invention.

A resist pattern can be formed wherein the MEEF is low and the resolution is excellent by utilizing a conventional unit, without entailing transcription shift, according to the method for forming a mask pattern of the present invention and according to the method for forming a resist pattern wherein multiple exposures are carried out on a semiconductor wafer using the mask pattern of the present invention.

Accordingly, the transfer of the dimensional dispersion on a mask to a wafer can be limited to the minimum, resulting in a reduction in the dimensional dispersion on a wafer. Thereby, a high manufacturing yield of LSI chips can be secured.

Description of Reference Numerals 1 graph line wherein MEEF=1.0
2 graph line showing the result of transcription experiments of a180 nm isolated line
3 graph line wherein MEEF=1.0
4 graph line showing the result of transcription experiments of a180 nm line and space 5 graph line showing the correlation between the mask dimensions and the MEEF when a positive resist and a KrF halftone mask are combined
6 graph line showing the correlation between the mask dimensions and the MEEF when a positive resist and a KrF Levenson mask are combined
7 quarz substrate
8 light-shielding pattern
9 positive resist
10 negative resist
11 wafer substrate
12 MEEF when positive resist and KrF halftone mask (CD 200 nm) are combined
13 MEEF when negative resist and KrF halftone mask (CD 140 nm) are combined
14 line of ED window of a positive resist
15 line of ED window of a negative resist
16 mask pattern according to design
17 mask pattern for multiple exposure
18 portions that have not been exposed to light during first exposure
19 portions that have been half-exposed to light during first exposure
20 portions that have not been exposed to light during second exposure
21 portions that have been half-exposed to light during second exposure
22 regions other than portions that have been exposed twice by means of two exposures (regions that have been exposed one time or that have not been exposed at all)
23 regions that have been exposed twice by means of two exposures

What is claimed is:

1. A multiple exposure mask pattern for multiple exposures for forming a resist pattern with an unvarying pattern pitch on a semiconductor wafer, which is utilized instead of a one exposure mask pattern having a width of an aperture pattern of the one exposure mask smaller than a width of a light-shielding pattern of the one exposure mask, wherein the multiple exposure mask pattern for multiple exposures comprises an aperture pattern and a light-shielding pattern with apertures between light-shielding portions, where the multiple exposure mask pattern has a pattern pitch that is the same as that of the one exposure mask pattern and has a width of the aperture pattern of the multiple exposure mask pattern that is greater than a width of the light-shielding pattern of the multiple exposure mask pattern.

2. The mask pattern according to claim 1, wherein the multiple exposure mask pattern is formed of chrome.

3. The mask pattern according to claim 1, wherein the multiple exposure mask pattern is formed of silicon.

4. The mask pattern according to claim 1, wherein the aperture pattern of the multiple exposure mask pattern is formed using a halftone mask that becomes a phase shifter.

5. The mask pattern according to claim 1, wherein the aperture pattern of the multiple exposure mask pattern is formed using a Levenson mask that becomes a phase shifter.

6. The mask pattern according to claim 1, wherein the light-shielding pattern of the multiple exposure mask pattern is formed by using a binary mask made of chrome.

7. The mask pattern according to claim 1, wherein the light-shielding pattern of the multiple exposure mask pattern is formed by using a halftone mask made of MoSiO.

* * * * *